OPTICALLY-COUPLED OSCILLATOR CIRCUIT

Filed Feb. 27, 1967

INVENTOR
JOSEPH WILLIAM SHARP
BY Harold Patton
ATTORNEY

United States Patent Office 3,419,816
Patented Dec. 31, 1968

3,419,816
OPTICALLY-COUPLED OSCILLATOR CIRCUIT

Joseph W. Sharp, East St. Louis, Ill., assignor to Monsanto Company, St. Louis, Mo., a corporation of Delaware Filed Feb. 27, 1967, Ser. No. 618,693
14 Claims. (Cl. 331—107)

ABSTRACT OF THE DISCLOSURE

The disclosure of the present invention includes a description of a unique oscillator circuit wherein electromagnetic radiation, such as visible light, is internally generated by a solid-state device and positively fed back to the input of the oscillator amplifying device by means of a transducer which converts the radiation into a corresponding electrical signal. For purposes of illustrating the invention, the radiation means is disclosed as a solid-state, light-emitting diode, an infrared device, or a laser diode, while the transducer is disclosed as a solar cell, photoresistor photocell, or similar device.

*Introduction*

The present invention relates generally to oscillator circuits, and more particularly to an oscillator circuit employing radiative or optically-coupled feedback to sustain the desired oscillations.

In the field dealing with the design of oscillator circuits, it has been the general practice to employ resistive-capacitive or inductive-capacitive feedback circuits in the oscillator feedback loop or negative feedback type circuits. Although these types of feedback circuits have served the general purpose, under some conditions of service certain troublesome problems arise; for example, when the oscillator is connected to particular loads, sufficient isolation is not provided by the feedback loop to avoid loading the amplifying component of the oscillator. In addition, oscillators employing capacitors and inductors are not readily adaptable to integrated circuit fabrication.

The general purpose of the present invention is to provide an oscillator circuit which embraces most of the advantages of similarly employed oscillators, and yet does not possess the aforedescribed disadvantages.

To attain this, the present invention utilizes a unique oscillator feedback loop which includes a solid-state, two-terminal radiation device and a transducer which converts the radiated signal into an electrical signal and drives the amplifying component of the oscillator. Although the oscillator circuit of the present invention may be comprised of discrete components, it is readily adaptable to integrated circuit fabrication and is particularly contemplated for manufacture on a single semiconductor chip.

An object of the present invention is the provision of a novel oscillator circuit employing radiative or optically-coupled feedback.

Another object is to provide an oscillator having substantially complete electrical isolation between its output circuit and the circuit employed to determine the frequency of oscillations thereof.

A further object of the invention is the provision of a solid-state, optically-coupled oscillator having enhanced frequency stability and susceptible to fabrication by conventional integrated circuit techniques.

*Brief summary of the invention*

In the present invention these purposes (as well as others apparent herein) are achieved generally by providing an oscillator circuit including an amplifying component whose output terminals are electrically coupled to a two-terminal, solid-state, device for generating electromagnetic energy. A transducer is positioned in the feedback circuit of the oscillator to receive energy so emitted from the device and provide an electrical signal to the amplifying component, which signal sustains the oscillations of the circuit.

*Description of the drawings*

Utilization of the invention will become apparent to those skilled in the art from the disclosures made in the following detailed description of preferred embodiments of the invention as illustrated in the accompanying drawings, in which.

*Detailed description*

Figure 1:
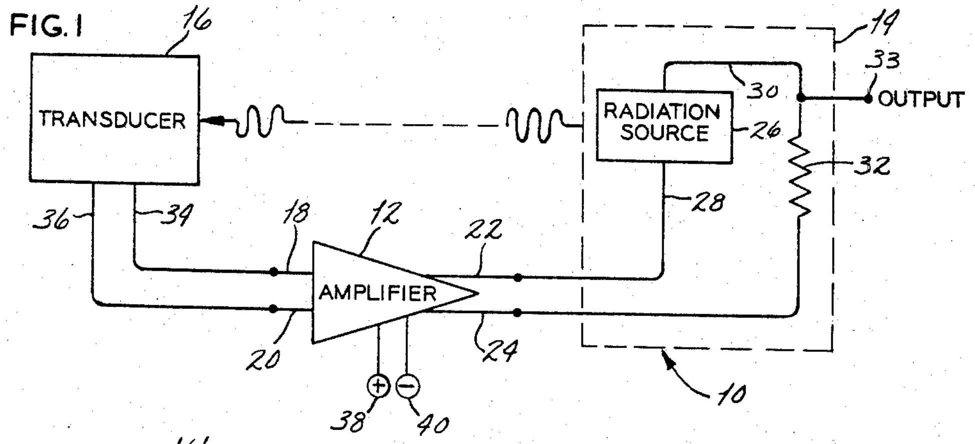
FIG. 1 is a schematic circuit diagram of an oscillator circuit embodying the present invention.

Referring now to the drawings, wherein like reference characters designate like or corresponding parts throughout the several views, there is shown in FIG. 1 an oscillator circuit, generally designated 10. The oscillator circuit 10 comprises an amplifier 12, an output circuit, indicated by the dashed line 14, and a transducer 16. The amplifier 12 has two input terminals 18, 20 and two output terminals 22, 24. The output circuit 14 includes a two-terminal radiation source 26, whose one terminal 28 is connected to the output terminal 22 of the amplifier 12 and whose other terminal 30 is connected to one side of a load resistor 32. The other side of the load resistor 32 is returned and connected to the output terminal 24 of the amplifier 12.

A transducer 16 is positioned in close proximity to the radiation source 26, so that electromagnetic energy emitted from the source 26 will impinge upon the transducer 16, thereby to produce at its output terminals 34, 36 a time-variant voltage signal suitable for driving the amplifier 12. As may be seen, the output terminals 34, 36 are electrically coupled to the input terminals 18, 20 respectively, of the amplifier 12. A power supply source, indicated by the positive and negative terminals 38 and 40, is connected to the amplifier 12 to provide energizing power for the amplifier 12 in the well known manner.

When the terminals 38, 40 of the power supply source are activated to energize the amplifier 12 of FIG. 1, an output signal is provided at its terminals 22, 24. By properly choosing the amplifier 12 with a given radiation source 26, this signal can be made sufficient to supply the necessary current and voltage required to energize the radiation source 26. So energized, the radiation source 26 will emit electromagnetic radiation which in turn is directed to the transducer 16. The transducer 16 converts the electromagnetic radiation into an electrical signal corresponding thereto and delivers it by means of input terminals 18, 20 to the amplifier 12 which is driven thereby. It may be observed that the oscillator circuit 10 will oscillate by means of the positive feedback provided by the electromagnetic coupling between the output terminals 22, 24 and input terminals 18, 20 of the amplifier 12. The frequency of the oscillations of oscillator 10 is determined by the response time of the slowest of the elements in the oscillator loop. Each element (the radiation source 26, the transducer 16, and the amplifier 12) is characterized by an inherent response time corresponding to the time delay between the instant an input signal is applied to it and the time that a change in its output occurs. The frequency of the oscillator 10 of FIG. 1, as well as that of FIGS. 2 and 4 to be described hereinafter, is determined by the inherent response time of the slowest element of the elements in the oscillator loop. The waveform of the output signal is not critical and may take any one of various forms. Where one of the elements is appreciably slower than the others, the waveform will be substantially a square wave.

The oscillator output may be taken from the output terminal 33. Alternatively, the oscillator output may be taken from an additional two-terminal, solid-state light-emitting device, such as a conventional gallium-arsenide-phosphide diode, substituted for, or in series circuit with the load resistor 32.

Figure 2:
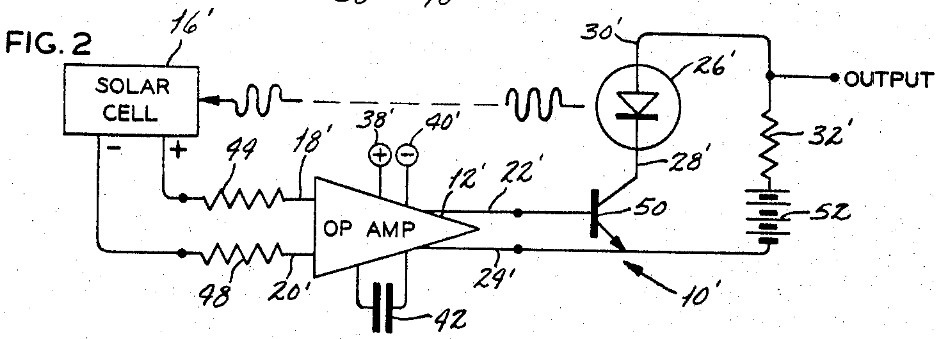
FIG. 2 is a circuit diagram of one possible alternative embodiment of an oscillator circuit of this invention.

Referring now to FIG. 2 there is shown an oscillator circuit, generally designated 10′. In this embodiment the amplifier 12′ is shown as an operational amplifier having a feedback loop including the capacitor 42. The capacitor 42 is chosen to provide a predetermined frequency response for the oscillator 10′ and sufficient gain to drive the radiation device 26′ in the output circuit of the oscillator 10′. In addition, the operational amplifier 12′ is provided with resistors 44 and 48 at its input terminals for properly matching the input impedance of the amplifier 12′ to the transducer 16′.

In one particular design of the oscillator 10′ the operational amplifier 12′ was a Fairchild Semiconductor μA 702 operational amplifier, the capacitor 42 had a value of about 100 picofarads, the resistors 44 and 48 each had a value of 47 ohms. In this case the operational amplifier provided a gain of about 60 db.

The output terminal 22′ of the operational amplifier 12′ is connected to the base electrode of an NPN-type transistor 50, which has its emitter electrode connected to the output terminal 24′ of the operational amplifier 12′. The collector electrode of the transistor 50 is connected to the cathode electrode 28′ of a solid-state, light-emitting, electroluminescent diode 26′. For example, the diode 26 may be of the gallium-arsenide-phosphide (GaAsp) type, which when operating in the forward current mode of 10–20 milliamps, emits visible light. Alternatively, the diode 26′ may be an infrared light-emitting device such as a gallium arsenide (GaAs) device characterized by the emission of light within the infrared region, or it may be a solid-state laser diode. It should be understood that in the case of the laser diode higher currents may be required and it might have to be operated in a pulse mode.

The anode electrode 30′ of the solid-state diode 26′ is connected to the load resistor 32′ which in turn is connected to the positive terminal of a D.C. battery 52. The negative terminal of the battery 52 is connected to the emitter electrode of the transistor 50.

In the oscillator circuit 10′ of FIG. 2, a solar cell 16′ is positioned to receive radiation from the solid-state diode 26′. The solar cell 16′ serves to convert the light from diode 26′ into a voltage signal for driving the input terminals 18′, 20′ of the operational amplifier 12′. Inasmuch as the solar cell 16′ is not critical, any commercially available cell suitable for the particular oscillator may be used. Alternatively any suitable protovoltaic device may be substituted for the solar cell 16′ without modifying the operation of the circuit 10′.

In operation, the oscillator circuit 10′ differs from the oscillator 10 in that the operational amplifier 12′ controls the emitter-collector path conduction of the transistor 50 by means of the voltage signal applied to its base and emitter electrodes. In this manner, the transistor 50 serves to control the supply of current from the battery 52, through the load resistor 32′, and the light-emitting diode 26′. That is, even though the operational amplifier 12′ cannot deliver sufficient power itself to energize the diode 26′, it can be used to control the power supplied by battery 52, which power is sufficient to actuate the diode 26′ and produce light emission therefrom. The emitted light is converted into a varying voltage signal by means of the solar cell 16′ and used to drive the operational amplifier 12′ of the oscillator circuit 10′ to sustain the desired oscillations.

It should be pointed out that the upper frequency limit of the oscillator circuit depends on the element in the feedback loop having the slowest frequency response. Solid-state diodes in commercial use have turn-on, turn-off speeds of about 5 nanoseconds and are limited principally by capacitance introduced by the device or "can" in which the semiconductor chip is packaged. Notwithstanding, such diodes can be operated at about 150 mHz. and, with improved packaging, may be operated at still higher frequencies. Commercially available solid-state photoresistive devices also have response times of about 5 ns.

Figure 3:
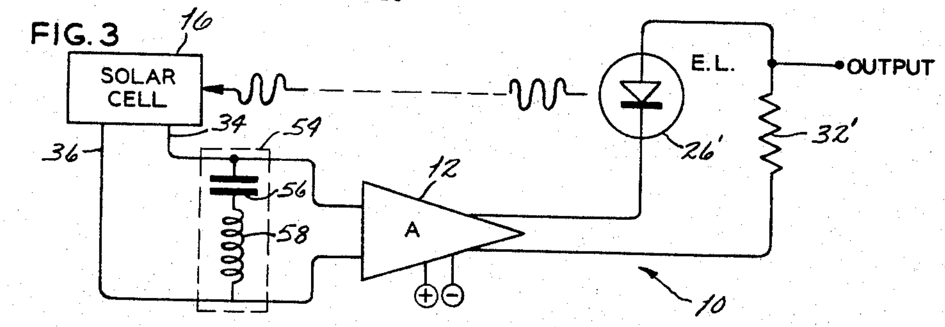
FIG. 3 is a circuit diagram of an oscillator circuit embodying the present invention and including a frequency-determining network.

Referring now to FIG. 3 there is shown another alternative embodiment of the oscillator circuit 10 of the present invention. In this embodiment the amplifier 12 and optically-coupled feedback path are substantially the same as that described with reference to FIGS. 1 and 2. However, in the input circuit of the amplifier 12 there is provided a frequency-determining network 54, comprising a capacitor 56 and an inductor 58 connected together across the input terminals of the amplifier 12. In operation the frequency-determining network 54 establishes the particular frequency at which the oscillator 10 of FIG. 3 will oscillate. It should be noted that the frequency-determining network for the oscillator 10 is electrically isolated from the output circuit by means of the optically-coupled feedback circuit. That is, the connection of the output terminal of the oscillator 10 to a load circuit will not be coupled to the frequency-determining network, because the optically-coupled feedback provides substantially complete electrical isolation. Thus, the load connected to the oscillator circuit will not adversely affect its frequency stability.

Figure 4:
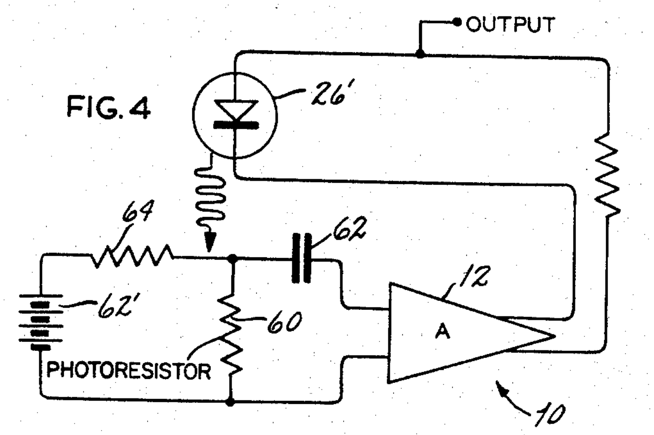
FIG. 4 is a circuit diagram of still another embodiment of the oscillator circuit of this invention.

Referring now to FIG. 4, there is shown still another alternative embodiment of the present invention. Instead of a solar cell or other similar photovoltaic transducer, a photoresistor 60 is connected to the input terminals 18, 20 of the amplifier 12 by means of the coupling capacitor 62. A battery 62′ and current-limiting resistor 64 are connected across the terminals of the photoresistor 60 for the purpose of providing proper bias thereto.

In the oscillator circuit of FIG. 4, the light emitted from the solid-state diode 26′ in the output circuit of the oscillator 10 is fed back and caused to impinge upon the photoresistor 60 to modify the current flow through it. This produces a voltage change across the photoresistor 60 and the A.C. component of this voltage signal is coupled to the input terminals 18, 20 of the amplifier 12 by means of the coupling capacitor 62.

In summary, the present invention provides an oscillator employing an improved feedback technique. Internal solid-state oscillator circuitry generates an optical signal which couples the input and output circuits of the oscillator.

Obviously many modifications and variations of the present invention are possible in light of the above teachings. It is therefore to be understood that the invention may be practiced otherwise than as specifically described.

I claim:

1. An oscillator circuit, comprising amplifying means including input and output terminals,
  said output terminals of said amplifying means being electrically coupled to an output circuit including means responsive to signals from said amplifying means for radiating electromagnetic energy corresponding thereto, and
  transducer means positioned to receive said emitted energy from said radiation means and electrically coupled to said input terminals of said amplifying means, said transducer means providing to said amplifying means a positive feedback electrical signal corresponding to said radiated energy,
  whereby said radiated energy generated internally of said oscillator circuit serves as a feedback signal to sustain oscillations of said oscillator circuit.

2. The oscillator circuit as defined in claim 1, wherein: said radiation means is a light-emitting, solid-state diode.

3. The oscillator circuit as defined in claim 1, wherein said radiation means is a solid-state diode characterized by radiated emission in the infrared region.

4. The oscillator circuit as defined in claim 1, wherein: said radiation means is a solid-state laser diode characterized by radiated emission of coherent light.

5. The oscillator circuit as defined in claim 1, wherein: said transducer means is a photovoltaic device.

6. The oscillator circuit as defined in claim 2, wherein: said transducer means is a silicon solar cell.

7. The oscillator circuit as defined in claim 1, wherein: said output circuit further comprises a power supply source, and means connecting said power supply means and said radiation means for selectively controlling the current supplied to said radiation means by said power source.

8. The oscillator circuit as defined in claim 7, wherein: said means for controlling the current from said power supply to said radiation means includes, a transistor having its base coupled to said output of said amplifying means and its emitter-collector circuit connected in series with said radiation means and said power supply means.

9. An oscillator circuit, comprising amplifying means including input and output terminals, said output terminals of said amplifying means being coupled to an output circuit including means responsive to signals from said amplifying means for radiating electromagnetic energy corresponding thereto, and a photoresistor positioned to receive said emitted energy from said radiation means and electrically coupled to said input terminals of said amplifying means, said photoresistor providing to said amplifying means a positive feedback electrical signal corresponding to said radiated energy.

10. The oscillator circuit as defined in claim 9, wherein:

said photoresistor is coupled to said amplifying means by a frequency-determining circuit.

11. The oscillator circuit as defined in claim 9, wherein: the said radiation means is a light-emitting, solid-state diode.

12. The oscillator circuit as defined in claim 9, wherein: said radiation means is a solid-state diode characterized by radiated emission in the infrared region.

13. The oscillator circuit as defined in claim 9, wherein: said radiation means is a laser diode characterized by the radiated emission of coherent light.

14. An oscillator circuit, comprising:

an amplifier including input and output terminals and characterized by a predetermined frequency response and gain, said output terminals of said amplifier being connected to an output circuit including a light-emitting diode characterized by the emission of light when the current in said output circuit reaches a predetermined level, and a photovoltaic device positioned to receive said emitted light from said light-emitting diode and electrically coupled to the input terminals of said amplifier by means of a frequency-determining network, said photovoltaic device providing to said operational amplifier a positive feedback electrical signal corresponding to said light emission.

References Cited

UNITED STATES PATENTS

| | | | |
|---|---|---|---|
| 2,846,577 | 8/1958 | Blasingame | 331—135 X |
| 3,304,430 | 2/1967 | Biard et al. | 307—88.5 |
| 3,319,080 | 5/1967 | Cornely et al. | 307—88.5 |

OTHER REFERENCES

Electronic Design. Sept. 27, 1963, p. 68.

Kruse, "Uncooled IR Detectors For Long Wavelengths," Electronics, Mar. 25, 1960, pp. 62–64.

ROY LAKE, *Primary Examiner.*

S. H. GRIMM, *Assistant Examiner.*

U.S. Cl. X.R.

331—108, 117, 135